(12) United States Patent
Attanasio et al.

(10) Patent No.: US 12,267,084 B2
(45) Date of Patent: Apr. 1, 2025

(54) TRIMMING PROCEDURE AND CODE REUSE FOR HIGHLY PRECISE DC-DC CONVERTERS

(71) Applicant: STMicroelectronics S.r.l., Agrate Brianza (IT)

(72) Inventors: Marco Attanasio, Olbia-Tempio (IT); Stefano Ramorini, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 281 days.

(21) Appl. No.: 17/980,188

(22) Filed: Nov. 3, 2022

(65) Prior Publication Data

US 2024/0154515 A1   May 9, 2024

(51) Int. Cl.
    *H03M 1/78*   (2006.01)
    *H02M 1/00*   (2006.01)
    *H03M 1/10*   (2006.01)

(52) U.S. Cl.
    CPC ....... *H03M 1/1057* (2013.01); *H02M 1/0025* (2021.05); *H03M 1/785* (2013.01)

(58) Field of Classification Search
    CPC .......................... H03M 1/1057; H02M 1/0025
    See application file for complete search history.

(56) References Cited

U.S. PATENT DOCUMENTS

| | | |
|---|---|---|
| 4,138,671 A | 2/1979 | Comer et al. |
| 5,923,209 A | 7/1999 | Price et al. |
| 7,034,735 B1 | 4/2006 | Copley |
| 7,956,679 B2 | 6/2011 | Kimura |
| 10,101,358 B2 | 10/2018 | Cozac et al. |

*Primary Examiner* — Peter M Novak
(74) *Attorney, Agent, or Firm* — Crowe & Dunlevy LLC

(57) ABSTRACT

A converter system includes a reference buffer buffering a reference input to produce a DAC reference, operating from a reference feedback voltage generated by a reference divider. A tail buffer generates a tail voltage from an input voltage generated from the DAC reference by a tail divider. An R-2R type DAC utilizes an R-2R ladder to generate a DAC output from a code. This ladder has a tail resistor coupled to the tail voltage. A feedback buffer buffers the DAC output to produce a converter reference. A DC-DC converter generates a DC output from a DC input, based upon a converter feedback voltage. A feedback divider coupled between the DC output and the converter reference generates the converter feedback voltage. Control circuitry selectively taps the reference divider to produce the reference feedback voltage (performing gain trimming) and selectively taps the tail divider to produce the input voltage (performing offset trimming).

15 Claims, 4 Drawing Sheets

TRIMMING PROCEDURE AND CODE REUSE FOR HIGHLY PRECISE DC-DC CONVERTERS

TECHNICAL FIELD

This disclosure is directed to the field of DC-DC converters and, in particular, to circuitry and calibration procedures for generating a highly precise reference voltage for use in the feedback loop of a DC-DC converter to provide that DC-DC converter with a high degree of precision in the generated DC output voltage, as well as procedures to provide that DC-DC converter with an extended voltage range.

BACKGROUND

Now described with reference to FIG. 1A is a DC-DC converter system 5 that includes a DC-DC converter circuit 6 that converts an input DC voltage $DC_{IN}$ to an output DC voltage $DC_{OUT}$. A feedback loop for the DC-DC converter circuit 6 includes resistors R2 and R1 series connected between the output of the DC-DC converter circuit 6 and a reference voltage VDO. A feedback voltage VFBK is generated at the tap between resistors R2 and R1 and is used by the DC-DC converter circuit 6 in regulating its output DC voltage $DC_{OUT}$. The reference voltage VDO is generated by a digital-to-analog converter (DAC) 7 based upon a reference voltage REF_DAC and an n-bit input code CODEn. As should be appreciated, through the adjustment of the value of VDO by the DAC 7, since the value of VFBK is fixed by the negative feedback, the value of the output DC voltage $DC_{OUT}$ is adjusted.

An ideal example output range of the output DC voltage $DC_{OUT}$ of the DC-DC converter 6 is shown in FIG. 1B. As can be observed in this example, the output DC voltage $DC_{OUT}$ ideally ranges from −0.8V when the input code CODEn is at its minimum value to −6.6V when the input code CODEn is at its maximum value. However, real world components are not ideal. Indeed, error in the generation of the reference voltage REF_DAC or in the values of the resistors R1 and R2 results in gain error at multiple ones of the DAC steps (a single increment in CODEn being a DAC step); this may be observed in FIG. 1C, in which two possible instances of error are possible (e.g., the slope of the output DC voltage $DC_{OUT}$ between the minimum value of CODEn and the maximum value of CODEn being such that the output DC voltage $DC_{OUT}$ is above or below the desired value of −6.6V when CODEn is at its maximum value). Error in the DAC 7 or within feedback circuitry within the DC/DC converter circuit 6 results in the introduction of an offset; this may be observed in FIG. 1D, in which the curve of the output DC voltage $DC_{OUT}$ is shifted downwardly such that when CODEn is at its minimum value the output DC voltage $DC_{OUT}$ is less than −0.8V, and such that when CODEn is at its maximum value the output DC voltage $DC_{OUT}$ is less than −6.6V.

To avoid gain error (FIG. 1C) and offset error (FIG. 1D), further development is needed.

SUMMARY

Disclosed herein is a DC-DC converter system including: a reference buffer configured to buffer a reference input signal at its input to produce a digital-to-analog conversion (DAC) reference signal at its output, and operating based upon a reference feedback voltage generated by a reference resistive divider; a tail buffer configured to generate a tail voltage based upon an input voltage generated from the DAC reference signal by a tail resistive divider; a R-2R type digital to analog converter (DAC) configured to utilize a R-2R resistive ladder to generate a DAC output voltage at a DAC output based upon an input code, the R-2R resistive ladder having a tail resistor coupled to the tail voltage; a feedback buffer configured to buffer the DAC output voltage to produce a converter reference voltage; a DC-DC converter configured to generate a DC output voltage at a DC output node from a DC input voltage at a DC input node, based upon a converter feedback voltage; a feedback resistive divider coupled between the DC output node and the converter reference voltage, with the converter feedback voltage being generated at a tap of the feedback resistive divider; and control circuitry.

The control circuitry is configured to: selectively tap the reference resistive divider to produce the reference feedback voltage, thereby performing gain trimming of the DC output voltage; and selectively tap the tail resistive divider to produce the input voltage for the tail buffer, thereby performing offset trimming of the DC output voltage.

The reference buffer may be an amplifier having its non-inverting input terminal coupled to receive the reference input signal and its inverting input terminal coupled to its output through the reference resistive divider. In addition, the control circuitry may selectively tap the reference resistive divider by generating a first trim control word passed to switches of the reference resistive divider to thereby select a resistance between the inverting input terminal and output of the amplifier of the reference buffer, the switches of the reference resistive divider being equal in number to bits of the first trim control word.

The tail buffer may be an amplifier having its inverting input terminal coupled to its output terminal, and having its non-inverting input terminal coupled to receive the input voltage from the tail resistive divider. In addition, the control circuitry may selectively tap the tail resistive divider by generating a second trim control word passed to switches of the tail resistive divider to thereby select a resistance between the output of the reference buffer and the non-inverting input terminal of the tail buffer, the switches of the tail resistive divider being equal in number to bits of the second trim control word.

The input code may have n-bits, and the R-2R resistive ladder may include: the tail resistor; n-1 resistors connected in series between the tail resistor and the DAC output, the n-1 resistors each having one-half a resistance of the tail resistor; and n resistors, each of the n resistors connected between a different tap to which one of the n-1 resistors is connected and a respective switch that selectively connects that one of the n resistors to either ground or the tail voltage based upon the input code.

The control circuitry, in a calibration mode, may perform the gain trimming of the DC output voltage until a range of the DC output voltage is equal to a desired range. If a negative offset is present in the DC output voltage based upon a comparison to a desired offset, the control circuitry may perform the offset trimming until an offset of the DC output voltage is equal to a desired offset, and if a positive offset is present in the DC output voltage based upon a comparison to a desired offset, the control circuitry may increment the input code until a negative offset is present in the DC output voltage and then performs the offset trimming until an offset of the DC output voltage is equal to a desired offset.

The control circuitry, in a further calibration mode, may increase the reference input signal until the range of the DC output voltage is equal to a desired additional range.

Also disclosed herein is a method aspect. The method aspect may include: generating a reference feedback voltage at a reference resistive divider; generating a reference input signal produce a digital-to-analog conversion (DAC) reference signal, based upon the reference feedback voltage; generating an input voltage from the DAC reference signal; generating a tail voltage based upon the input voltage; generating a DAC output voltage based upon an input code and the tail voltage, using an R-2R type digital to analog voltage converter (DAC); generating a converter reference voltage form the DAC output voltage; generating a converter feedback voltage at a tap of a feedback resistive divider; generating a DC output voltage at a DC output node from a DC input voltage at a DC input node, based upon the converter feedback voltage; selectively tapping the reference resistive divider to produce the reference feedback voltage, thereby performing gain trimming of the DC output voltage; and selectively tapping a tail resistive divider to produce the input voltage, thereby performing offset trimming of the DC output voltage.

Selectively tapping the reference resistive divider may be performed by operating switches of the reference resistive divider according to a first trim control word, the switches of the reference resistive divider being equal in number to bits of the first trim control word.

Selectively tapping the tail resistive divider may be performed by operating switches of the tail resistive divider according to a second trim control word, the switches of the tail resistive divider being equal in number to bits of the second trim control word.

In a calibration mode: the gain trimming of the DC output voltage may be performed until a range of the DC output voltage is equal to a desired range; and if a negative offset is present in the DC output voltage based upon a comparison to a desired offset, the offset trimming may be performed until an offset of the DC output voltage is equal to a desired offset.

In a calibration mode: the gain trimming of the DC output voltage may be performed until a range of the DC output voltage is equal to a desired range; and if a positive offset is present in the DC output voltage based upon a comparison to a desired offset, the input code may be incremented until a negative offset is present in the DC output voltage and then performing the offset trimming until an offset of the DC output voltage is equal to a desired offset.

In a further calibration mode, the reference input signal may be increased until the range of the DC output voltage is equal to a desired additional range.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. Do note that in the below description, any described resistor or resistance is a discrete device unless the contrary is stated, and is not simply an electrical lead between two points. Thus, any described resistor or resistance coupled between two points has a greater resistance than a lead between those two points would have, and such resistor or resistance cannot be interpreted to be a lead. Similarly, any described capacitor or capacitance is a discrete device unless the contrary is stated, and is not a parasitic unless the contrary is stated. Moreover, any described inductor or inductance is a discrete device unless the contrary is stated, and is not a parasitic unless the contrary is stated. Furthermore, any "switch" described herein may be understood to be formed by one or more transistors of a suitable type.

Figure 1A:
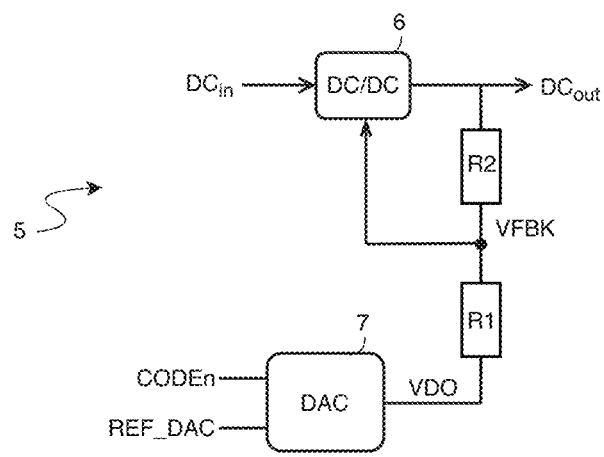
FIG. 1A is a block diagram of a prior art DC-DC converter system.
Figures 1B, 1C:
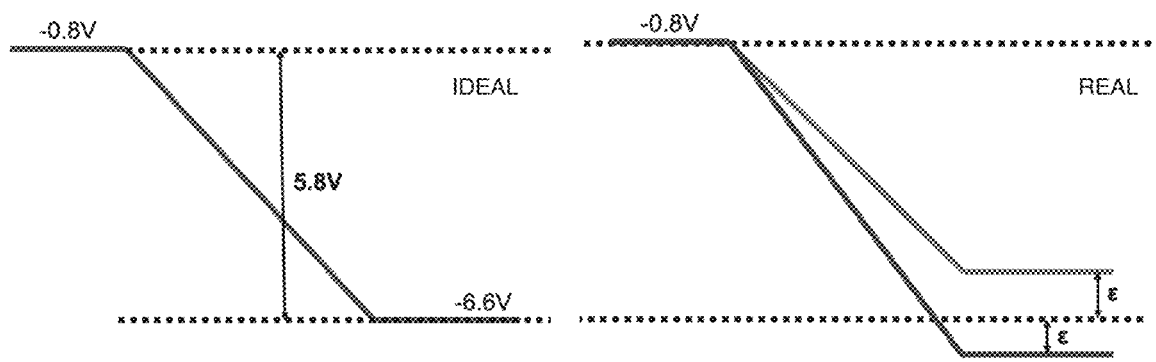
FIG. 1B is a graph showing the output voltage of the DC-DC converter system of FIG. 1A in an ideal case.
FIG. 1C is a graph showing the output voltage of the DC-DC converter system of FIG. 1A in a real case in which gain error occurs.
Figure 1D:
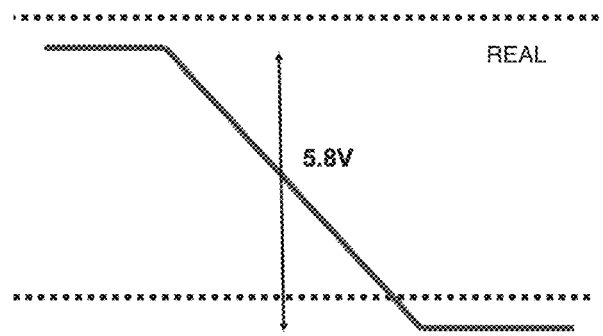
FIG. 1D is a graph showing the output voltage of the DC-DC converter system of FIG. 1A in a real case in which offset error occurs.
Figure 2:
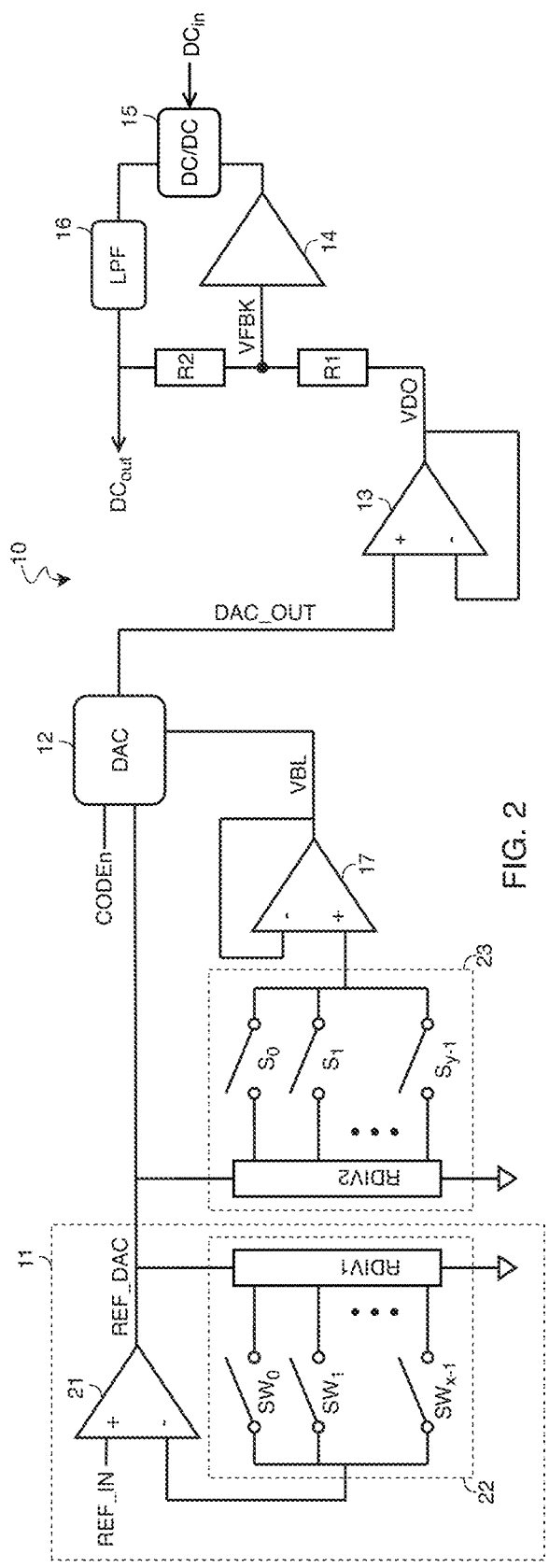
FIG. 2 is a schematic block diagram of a DC-DC converter system described herein which provides for adjustment/correction of both gain and offset.

Now described with reference to FIG. 2 is a DC-DC converter system 10 described herein. The DC-DC converter system 10 includes a DC-DC converter circuit 15 that converts an input DC voltage $DC_{IN}$ to an output DC voltage $DC_{OUT}$. A feedback loop for the DC-DC converter circuit 15 includes resistors R2 and R1 series connected between the output of the DC-DC converter circuit 15 (after passage through a low-pass filter 16) and a reference voltage VDO. A feedback voltage VFBK is generated at the tap between resistors R2 and R1, and is passed through an error amplifier 14 to be used by the DC-DC converter circuit 15 in regulating its output DC voltage $DC_{OUT}$. The reference voltage VDO is generated by a chain including a reference buffer 11 and a digital-to-analog converter (DAC) 12.

The reference buffer 11 is formed by a reference amplifier 21 having its non-inverting input terminal coupled to receive a reference input signal REF_IN and its inverting input terminal coupled to its output terminal through a resistive circuit 22. The resistive circuit includes X switches $SW_0, \ldots, SW_{X-1}$ each being connected between the inverting input terminal of the reference amplifier 21 and a different respective tap of a resistive ladder RDIV1, the resistive ladder RDIV1 being connected between the output of the reference amplifier 21 and ground. The reference buffer 11 serves to buffer the reference input signal REF_IN to produce a reference voltage REF_DAC at the output of the reference amplifier 21.

The DAC 12 may be of R-2R type, uses the reference voltage REF_DAC as its reference voltage, and generates a DAC output voltage DAC_OUT based upon an n-bit input code CODEn. The DAC 12 includes a R-2R ladder (shown in FIG. 3) connected between a tail reference voltage VBL and the output of the DAC 12. The tail reference voltage VBL is generated by the chain of a resistive circuit 23 and a tail reference buffer 17.

The buffer 17 is formed by an amplifier 17 that has its non-inverting input terminal connected to the resistive circuit 23 and its inverting input terminal connected to its output terminal, with the reference voltage VBL generated at its output. The resistive circuit 23 includes a resistive ladder RDIV2 connected between the output of the reference buffer 11 and ground, with Y switches $S_0, \ldots, S_{Y-1}$ each being connected between a different respective tap of a resistive ladder RDIV2 and the non-inverting input terminal of the amplifier 17.

A DAC buffer 13 serves to buffer the DAC output voltage DAC_OUT to produce the reference voltage VDO. The DAC buffer 13 is formed by an amplifier 13 having its non-inverting input terminal connected to the output of the DAC 12 to receive the DAC output voltage DAC_OUT and its inverting input terminal connected to its output, with the reference voltage VDO being produced at the output of the amplifier 13.

Figure 3:
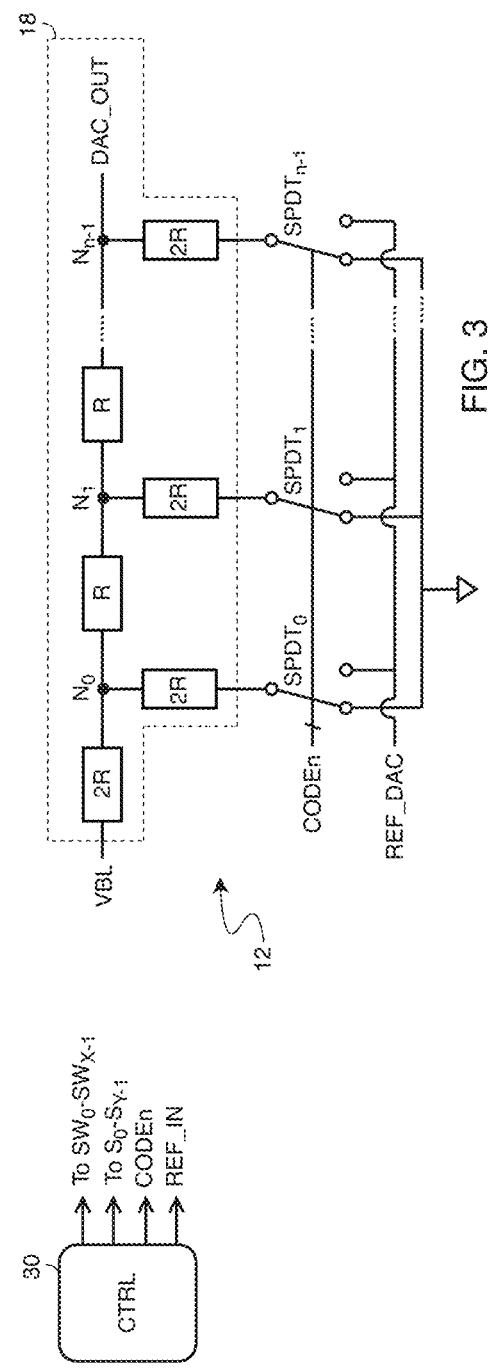
FIG. 3 is a schematic diagram of the digital-to-analog converter (DAC) of FIG. 2.

The DAC 12, as stated above, is of R-2R type, and is now described with additional reference to FIG. 3. The DAC 12 includes a R-2R resistor ladder 18 formed by n-1 resistors series connected between the reference voltage VBL and a final node $N_{n-1}$, with the DAC output voltage DAC_OUT being generated at the final node $N_{n-1}$. These n-1 resistors include a resistor 2R (having a resistance of 2·R) connected between the reference voltage VBL and node No, and then n-2 resistors R (each having a resistance of R), each being connected between different successive ones of the nodes $N_0, \ldots, N_{n-1}$—for example, a resistor R connected between nodes $N_0$ and $N_1$, a resistor R connected between nodes $N_1$ and $N_{n-2}$, and so on. The R-2R resistor ladder 18 includes a different resistor R2 (each having a resistance of 2·R) connected between a corresponding one of the nodes $N_0, \ldots, N_{n-1}$ and a respective one of the switches $SPDT_0, \ldots, SPDT_{n-1}$.

The switches $SPDT_0, \ldots, SPDT_{n-1}$ each selectively connect their associated one of the resistors R2 to either ground or the reference voltage REF_DAC dependent upon a respective bit of the n-bit code CODEn. When a given bit of CODEn is at a logic low (e.g., 0), its associated switch $SPDT_0, \ldots, SPDT_{n-1}$ connects its 2R resistor to ground, and when a given bit of CODEn is at a logic high (e.g., 1), its associated switch $SPDT_0, \ldots, SPDT_{n-1}$ connects its 2R resistor to the reference voltage REF_DAC. By way of example, if the least significant bit of CODEn is at a logic low, switch $SPDT_0$ will connect its 2R resistor to ground, and if the least significant bit of CODEn is at a logic high, switch $SPDT_0$ will connect its 2R resistor to REF_DAC. As another example, if the most significant bit of CODEn is at a logic low, switch $SPDT_{n-1}$ will connect its 2R resistor to ground, and if the most significant bit of CODEn is at a logic high, switch $SPDT_{n-1}$ will connect its 2R resistor to REF_DAC.

Control circuitry 30 controls switches $SW_0, \ldots, SW_{X-1}$ and switches $S_0, \ldots, S_{Y-1}$, and generates CODEn as well as REF_IN.

Operation is now described. First, the way in which the DC-DC converter system 10 provides for both gain and offset trimming (adjustment) will be described, and thereafter, calibration procedures for performing the gain and offset trimming will be described.

The changing of the feedback resistance connected between the inverting input terminal and output of the reference amplifier 21 through the closing of one or more of the switches $SW_0, \ldots, SW_{X-1}$, under control of the control circuitry 30, serves to trim the gain—adjusts the slope of the output DC voltage $DC_{OUT}$ between its minimum value and its maximum value with a final accuracy equal to approximately $$\frac{\text{STEP SIZE OF REF\_DAC}}{\text{REF\_DAC}} \times \frac{100}{2}.$$

In detail, the maximum gain of the output DC voltage $DC_{OUT}$ is dependent upon the number of bits n of the n-bit code CODEn, and may be calculated as:

$$\text{GAIN} = \frac{\text{REF\_DAC}}{2^8} \cdot \frac{R2}{R1}$$

Since the trimming operation performed through changing of the feedback resistance connected between the inverting input terminal and output of the reference amplifier 21 through the closing of one or more of the switches $SW_0, \ldots, SW_{X-1}$, under control of the control circuitry 30, ultimately changes the value of REF_DAC, and since the gain of the output DC voltage $DC_{OUT}$ is dependent upon REFDAC, gain control is therefore performed through the above described trimming. The effect of this gain adjustment accomplished through trimming can be seen in FIG. 4. The desired range between minimum and maximum value of the output DC voltage $DC_{OUT}$ is 5.8V. With a first setting of the switches $SW_0, \ldots, SW_{X-1}$, the desired range is not 5.8V; with a second setting of the switches $SW_0, \ldots, SW_{X-1}$, the desired range is still not 5.8V; however, with a third setting of the switches $SW_0, \ldots, SW_{X-1}$, the desired range of the output DC voltage $DC_{OUT}$ is properly 5.8V as desired.

The changing of the input resistance to the non-inverting input terminal of the amplifier 17 through the closing of one or more of the switches $S_0, \ldots, S_{Y-1}$, under control of the control circuitry 30, serves to change the reference voltage VBL and in turn trims the offset—adjusts the offset of the output DC voltage $DC_{OUT}$ in its range between its minimum value and its maximum value. The effect of this offset adjustment can be seen in FIG. 5. Notice that the application of offset trimming does not change the range/slope of the output DC voltage $DC_{OUT}$, but does serve to shift the output DC voltage $DC_{OUT}$ upward—the minimum and maximum voltages are each increased by the same amount Δ.

Through the adjustment of the value of the DAC output voltage DAC_OUT by the DAC 12, the value of VDO is adjusted, and in turn the value of the output DC voltage $DC_{OUT}$ is adjusted. As explained, through the adjustment of the value of the voltage VBL, the offset of the output DC voltage $DC_{OUT}$ is adjusted.

The potential step sizes in the values of the DAC output voltage DAC_OUT are dependent upon the number of bits n in the n-bit code CODEn. Namely, the steps may be as small as:

$$\Delta DAC_{OUT} = VBL/2^n.$$

Given the above, the potential step sizes in the value of the offset applied to the output DC voltage $DC_{OUT}$ are dependent upon the number of bits in n the n-bit code CODEn. These steps may be as small as:

$$\Delta DC_{OUT} = \frac{VBL}{2^n} \cdot \frac{R2}{R1}.$$

Figure 4:
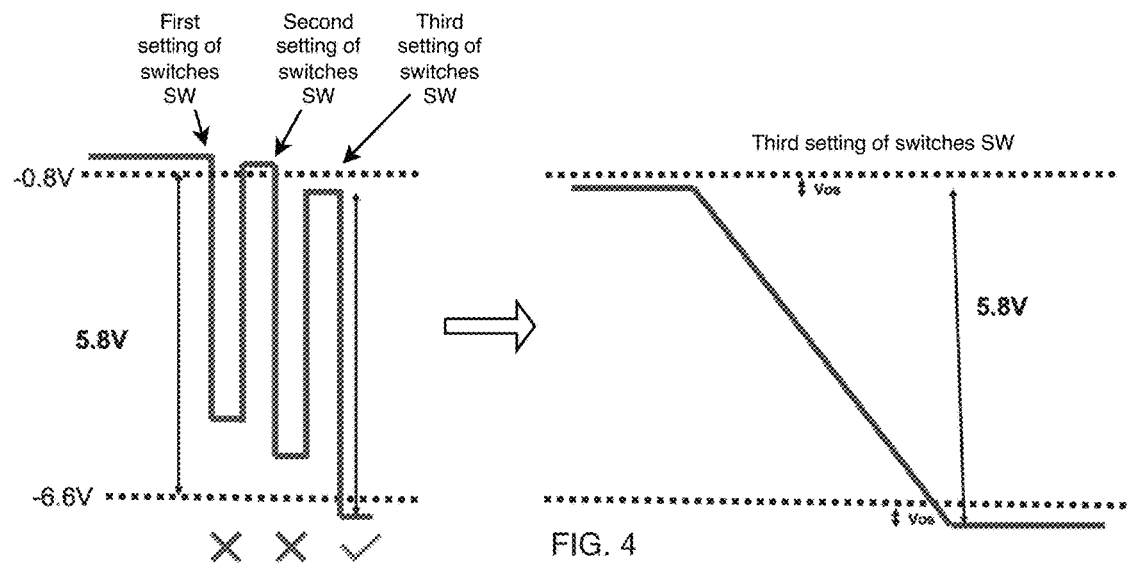
FIG. 4 is a graph showing the output voltage of the DC-DC converter system of FIG. 2 when performing gain trimming.

With the above understanding of how gain and offset trimming of the output DC voltage $DC_{OUT}$ is performed, procedures for performing the gain and offset trimming will now be described. In a calibration mode, the control circuitry 30 first performs gain trimming until the desired range between the minimum and maximum value of the output DC voltage $DC_{OUT}$ is reached. This can be performed by iteratively incrementing or decrementing the X-bit control word applied to the switches $SW_0, \ldots, SW_{X-1}$, such as shown in FIG. 4, until the desired range (gain) is reached.

Figure 5:
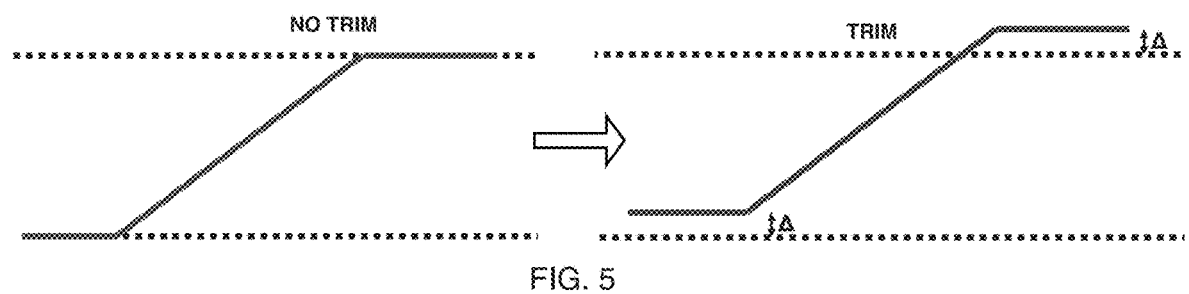
FIG. 5 is a graph showing the output voltage of the DC-DC converter system of FIG. 2 when performing offset trimming.
Figure 6A:
FIG. 6A is a graph showing the output voltage of the DC-DC converter system of FIG. 2 in a calibration mode when performing offset trimming, after performing gain trimming, in a case where the output voltage originally had a negative offset.

Next, offset trimming is performed. Two instances may occur. The first instance, shown in FIG. 6A, is where the output DC voltage $DC_{OUT}$ has a negative offset prior to offset trimming; offset trimming, as described above is then performed by iteratively incrementing or decrementing the Y-bit control word applied to the switches $S_0, \ldots, S_{Y-1}$, such as shown in FIG. 5, until the desired shift (offset) is reached.

Figure 6B:
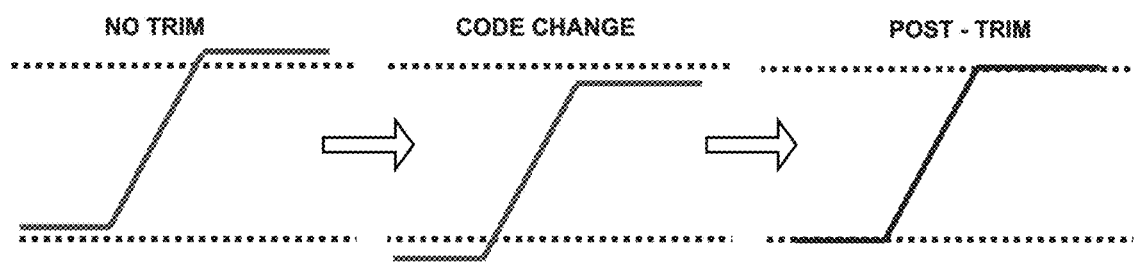
FIG. 6B is a graph showing the output voltage of the DC-DC converter system of FIG. 2 in a calibration mode when performing offset trimming, after performing gain trimming, in a case where the output voltage originally had a positive offset.

The second instance, shown in FIG. 6B, is where the output DC voltage $DC_{OUT}$ has a positive offset prior to offset trimming; here, the n-bit code CODEn is first incremented, which serves to shift the value of the DAC output voltage DAC_OUT upward, in turn shifting the output DC voltage $DC_{OUT}$ downward. As a result of this, the output DC voltage $DC_{OUT}$ now has a negative offset instead of a positive offset. Then, offset trimming, as described above, is performed. This completes the calibration mode, precisely trimming for both gain and offset.

Figure 7:
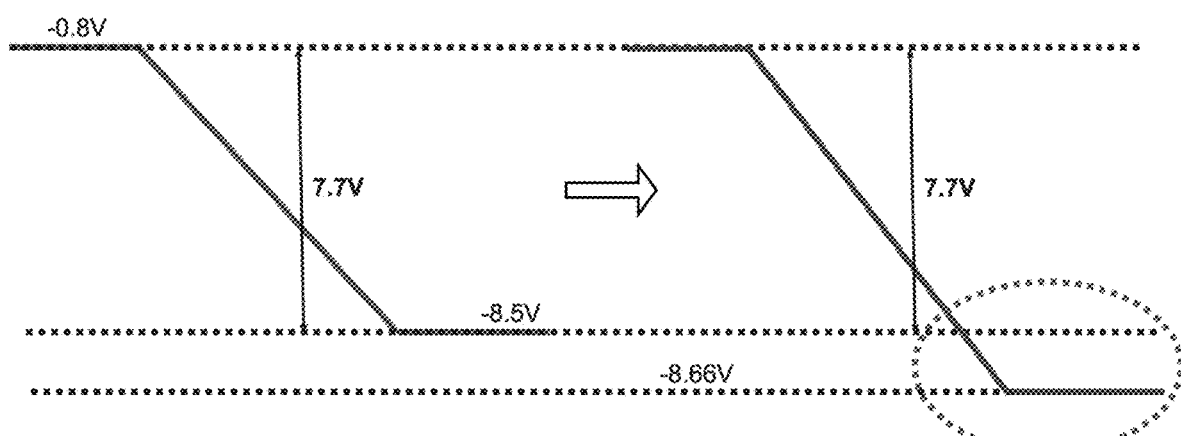
FIG. 7 is a graph showing the output voltage of the DC-DC converter system of FIG. 2 in a further calibration mode in which the gain is extended beyond what would normally be possible given the number of DAC input code bits used.

Optionally, a further calibration may be performed to permit adjusting the range of the output DC voltage $DC_{OUT}$ beyond what would be achievable for as given number n of the n-bit code CODEn. In order to do this, once the calibration described above is performed, REF_DAC is increased. This increase in REF_DAC serves to increase the individual step sizes during gain trimming, thereby increasing gain, as shown in FIG. 7—here, by increasing REF_DAC suitably, the range of the output DC voltage $DC_{OUT}$ between its minimum value and its maximum value is increased from 7.7V to 7.86V. The value of REF_DAC that accomplishes the desired increase in the range of the output DC voltage $DC_{OUT}$ may be stored in a register within the control circuitry 30 together with the initial value of REF_DAC, permitting switching between two different ranges of the output DC voltage $DC_{OUT}$. In fact, multiple different additional values of REF_DAC may be stored to permit selection between multiple different ranges of the output DC voltage $DC_{OUT}$.

Finally, it is clear that modifications and variations may be made to what has been described and illustrated herein, without thereby departing from the scope of this disclosure, as defined in the annexed claims.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A DC-DC converter system, comprising:
   a reference buffer configured to buffer a reference input signal at its input to produce a digital-to-analog conversion reference signal at its output, and operating based upon a reference feedback voltage generated by a reference resistive divider;
   a tail buffer configured to generate a tail voltage based upon an input voltage generated from the digital-to-analog conversion reference signal by a tail resistive divider;
   a R-2R type digital to analog converter (DAC) configured to utilize a R-2R resistive ladder to generate a DAC output voltage at a DAC output based upon an input code, the R-2R resistive ladder having a tail resistor coupled to the tail voltage;
   a feedback buffer configured to buffer the DAC output voltage to produce a converter reference voltage;
   a DC-DC converter configured to generate a DC output voltage at a DC output node from a DC input voltage at a DC input node, based upon a converter feedback voltage;
   a feedback resistive divider coupled between the DC output node and the converter reference voltage, with the converter feedback voltage being generated at a tap of the feedback resistive divider; and
   control circuitry configured to:
     selectively tap the reference resistive divider to produce the reference feedback voltage, thereby performing gain trimming of the DC output voltage; and
     selectively tap the tail resistive divider to produce the input voltage for the tail buffer, thereby performing offset trimming of the DC output voltage.

2. The DC-DC converter system of claim 1,
   wherein the reference buffer comprises an amplifier having its non-inverting input terminal coupled to receive the reference input signal and its inverting input terminal coupled to its output through the reference resistive divider; and
   wherein the control circuitry selectively taps the reference resistive divider by generating a first trim control word passed to switches of the reference resistive divider to thereby select a resistance between the inverting input terminal and output of the amplifier of the reference buffer, the switches of the reference resistive divider being equal in number to bits of the first trim control word.

3. The DC-DC converter system of claim 1,
   wherein the tail buffer comprises an amplifier having its inverting input terminal coupled to its output terminal, and having its non-inverting input terminal coupled to receive the input voltage from the tail resistive divider; and
   wherein the control circuitry selectively taps the tail resistive divider by generating a second trim control word passed to switches of the tail resistive divider to thereby select a resistance between the output of the reference buffer and the non-inverting input terminal of the tail buffer, the switches of the tail resistive divider being equal in number to bits of the second trim control word.

4. The DC-DC converter system of claim 3, wherein the input code has n-bits;
wherein the R-2R resistive ladder comprises:
the tail resistor;
n-1 resistors connected in series between the tail resistor and the DAC output, the n-1 resistors each having one-half a resistance of the tail resistor; and
n resistors, each of the n resistors connected between a different tap to which one of the n-1 resistors is connected and a respective switch that selectively connects that one of the n resistors to either ground or the tail voltage based upon the input code.

5. The DC-DC converter system of claim 1, wherein the control circuitry, in a calibration mode:
performs the gain trimming of the DC output voltage until a range of the DC output voltage is equal to a desired range;
when a negative offset is present in the DC output voltage based upon a comparison to a desired offset, performs the offset trimming until an offset of the DC output voltage is equal to a desired offset; and
when a positive offset is present in the DC output voltage based upon a comparison to a desired offset, increments the input code until a negative offset is present in the DC output voltage and then performs the offset trimming until an offset of the DC output voltage is equal to a desired offset.

6. The DC-DC converter system of claim 5, wherein the control circuitry, in a further calibration mode, increases the reference input signal until the range of the DC output voltage is equal to a desired additional range.

7. A DC-DC converter system, comprising:
a reference resistive divider configured to generate a reference feedback voltage;
a reference buffer configured to generate a digital-to-analog conversion reference signal based upon the reference feedback voltage;
a tail resistive divider configured to generate an input voltage;
a tail buffer configured to generate a tail voltage based upon the input voltage;
a digital to analog converter (DAC) configured to generate a DAC output voltage at a DAC output based upon an input code and the tail voltage;
a feedback buffer configured to buffer the DAC output voltage to produce a converter reference voltage;
a DC-DC converter configured to generate a DC output voltage at a DC output node from a DC input voltage at a DC input node based upon a converter feedback voltage; and
a feedback resistive divider coupled between the DC output node and the converter reference voltage, with the converter feedback voltage being generated at a tap of the feedback resistive divider.

8. The DC-DC converter system of claim 7,
wherein the reference buffer comprises an amplifier having its non-inverting input terminal coupled to receive a reference input signal and its inverting input terminal coupled to its output through the reference resistive divider.

9. The DC-DC converter system of claim 7,
wherein the tail buffer comprises an amplifier having its inverting input terminal coupled to its output terminal, and having its non-inverting input terminal coupled to receive the input voltage from the tail resistive divider.

10. A method, comprising:
generating a reference feedback voltage at a reference resistive divider;
generating a reference input signal produce a digital-to-analog conversion reference signal, based upon the reference feedback voltage;
generating an input voltage from the digital-to-analog conversion reference signal;
generating a tail voltage based upon the input voltage;
using an R-2R type digital to analog voltage converter (DAC) to generate DAC output voltage based upon an input code and the tail voltage;
generating a converter reference voltage from the DAC output voltage;
generating a converter feedback voltage at a tap of a feedback resistive divider;
generating a DC output voltage at a DC output node from a DC input voltage at a DC input node, based upon the converter feedback voltage;
selectively tapping the reference resistive divider to produce the reference feedback voltage, thereby performing gain trimming of the DC output voltage; and
selectively tapping a tail resistive divider to produce the input voltage, thereby performing offset trimming of the DC output voltage.

11. The method of claim 10, wherein selectively tapping the reference resistive divider is performed by operating switches of the reference resistive divider according to a first trim control word, the switches of the reference resistive divider being equal in number to bits of the first trim control word.

12. The method of claim 10, wherein selectively tapping the tail resistive divider is performed by operating switches of the tail resistive divider according to a second trim control word, the switches of the tail resistive divider being equal in number to bits of the second trim control word.

13. The method of claim 10, wherein, in a calibration mode:
the gain trimming of the DC output voltage is performed until a range of the DC output voltage is equal to a desired range; and
if a negative offset is present in the DC output voltage based upon a comparison to a desired offset, performing the offset trimming until an offset of the DC output voltage is equal to a desired offset.

14. The method of claim 10, wherein, in a calibration mode:
the gain trimming of the DC output voltage is performed until a range of the DC output voltage is equal to a desired range; and
if a positive offset is present in the DC output voltage based upon a comparison to a desired offset, incrementing the input code until a negative offset is present in the DC output voltage and then performing the offset trimming until an offset of the DC output voltage is equal to a desired offset.

15. The method of claim 14, further comprising in a further calibration mode, increasing the reference input signal until the range of the DC output voltage is equal to a desired additional range.

* * * * *